United States Patent
Wu et al.

(10) Patent No.: US 8,125,830 B2
(45) Date of Patent: Feb. 28, 2012

(54) AREA-EFFICIENT ELECTRICALLY ERASABLE PROGRAMMABLE MEMORY CELL

(75) Inventors: Xiaoju Wu, Irving, TX (US); Jozef Czeslaw Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/004,570

(22) Filed: Jan. 11, 2011

(65) Prior Publication Data

US 2011/0110160 A1 May 12, 2011

Related U.S. Application Data

(62) Division of application No. 12/474,444, filed on May 29, 2009, now Pat. No. 7,919,368.

(51) Int. Cl.
*G11C 11/34* (2006.01)
*H01L 27/108* (2006.01)

(52) U.S. Cl. ......... 365/185.18; 365/185.27; 365/185.28; 365/185.29; 365/185.3; 257/298; 257/315

(58) Field of Classification Search .................. 257/315, 257/298; 365/185.18, 185.27, 185.28, 185.29, 365/185.3
See application file for complete search history.

(56) References Cited

U.S. PATENT DOCUMENTS

| | | | |
|---|---|---|---|
| 7,095,076 B1 | 8/2006 | Han et al. | |
| 7,144,775 B2 | 12/2006 | Chaudhry et al. | |
| 2006/0262599 A1* | 11/2006 | Wu | 365/185.05 |
| 2007/0200180 A1* | 8/2007 | Irani et al. | 257/374 |
| 2010/0039868 A1* | 2/2010 | Mitchell et al. | 365/185.28 |

* cited by examiner

*Primary Examiner* — Long Tran
(74) *Attorney, Agent, or Firm* — Rose Alyssa Keagy; Wade J. Brady, III; Frederick J. Telecky, Jr.

(57) ABSTRACT

Electrically erasable programmable "read-only" memory (EEPROM) cells in an integrated circuit, and formed by a single polysilicon level. The EEPROM cell consists of a coupling capacitor and a combined read transistor and tunneling capacitor. The capacitance of the coupling capacitor is much larger than that of the tunneling capacitor. In one embodiment, field oxide isolation structures isolate the devices from one another; a lightly-doped region at the source of the read transistor improves breakdown voltage performance. In another embodiment, trench isolation structures and a buried oxide layer surround the well regions at which the coupling capacitor and combined read transistor and tunneling capacitor are formed.

1 Claim, 11 Drawing Sheets

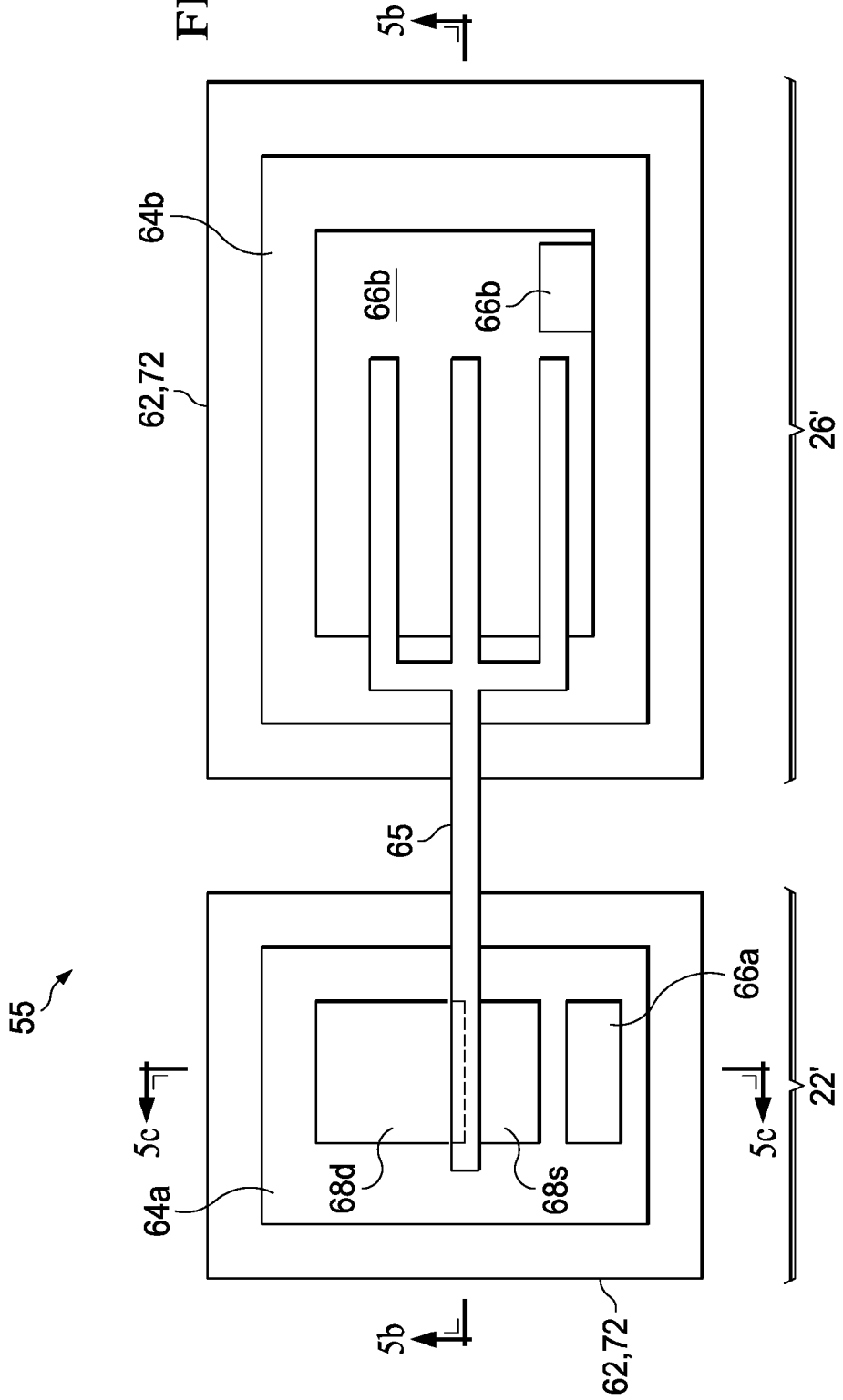

AREA-EFFICIENT ELECTRICALLY ERASABLE PROGRAMMABLE MEMORY CELL

This is a divisional application of application Ser. No. 12/474,444, filed on May 29, 2009, the entire disclosure of which is hereby incorporated by reference.

BACKGROUND OF THE INVENTION

This invention is in the field of integrated circuits, and is more specifically directed to memory cell construction in electrically erasable programmable read-only memories (EEPROMs).

Non-volatile solid-state read/write memory devices are now commonplace in many electronic systems, particularly in portable electronic devices and systems. A common technology for realizing non-volatile solid-state memory devices, more specifically for realizing electrically erasable programmable "read-only" memory (EEPROM) devices, utilizes "floating-gate" transistors to store the data state. According to this conventional technology, the memory cell transistor is "programmed" by biasing it so that electrons tunnel through a thin dielectric film onto an electrically isolated transistor gate element. The trapped electrons on the floating gate will raise the apparent threshold voltage of the memory cell transistor (for n-channel devices), as compared with the threshold voltage with no electrons trapped on the floating gate. This difference is made apparent by different source-drain conduction under normal transistor bias conditions. Modern EEPROM devices are "erasable" in that the memory cell transistors can be biased to remove the electrons from the floating gate, again by way of a tunneling mechanism. "Flash" memory devices are typically realized by EEPROM memory arrays, in which the erase operation is applied simultaneously to a large number (a "block") of memory cells.

According to one approach, EEPROM cells are realized by metal-oxide semiconductor (MOS) transistors having two polysilicon gate electrodes. A control gate electrode is electrically connected to decode and other circuitry in the EEPROM integrated circuit, and a floating gate is disposed between the control gate electrode and the channel region of the memory transistor. In this conventional construction, electrons tunnel to the floating gate upon application of a high programming voltage to the control gate (which capacitively couples to the floating gate) relative to the source and drain regions of the memory transistor.

Because of the convenience and efficiency of modern flash EEPROM memories, it is now desirable and commonplace to embed EEPROM memory within larger scale integrated circuits, such as modern complex microprocessors, digital signal processors, and other large-scale logic circuitry. Such embedded EEPROM can be used as non-volatile program memory storing software routines executable by the processor, and also as non-volatile data storage. On a smaller scale, EEPROM memory cells can be used to realize control registers by way of which a larger scale logic circuit can be configured, and used to "trim" analog levels after electrical measurement. In such embedded applications, a double-level-polysilicon process may not be available for the EEPROM if the embedding logic circuit does not require such a complex structure. As such, EEPROM cells constructed by a single polysilicon level process are known.

FIG. 1a is an electrical schematic of conventional single polysilicon level EEPROM memory cell 1. In this conventional single-poly example, memory cell 1 consists of floating-gate transistor 2, tunneling capacitor 4 and coupling capacitor 6. Floating-gate transistor 2 is an n-channel MOS transistor with source terminal S and drain terminal D; the body node (not shown in FIG. 1a) is generally connected to the transistor source. Floating gate FG is an electrically isolated conductive structure that serves as the gate of transistor 2 and that serves as a plate of each of tunneling capacitor 4 and coupling capacitor 6. Tunneling capacitor 4 is connected between terminal T and floating gate FG, and coupling capacitor 6 is connected between terminal P and floating gate FG.

In this example, transistor 2 is constructed so that it is a depletion mode device (i.e., threshold voltage <0) if no electrons are trapped on floating gate FG. On the other hand, trapped electrons on floating gate FG will raise the threshold voltage of transistor 2 above zero volts, in which case floating gate FG holds transistor 2 off. The presence or absence of source-drain conduction in response to a positive drain-to-source voltage thus depends on whether electrons are trapped on floating gate FG. If transistor 2 is "programmed" (i.e., electrons trapped on floating gate FG), source-drain conduction is zero for a positive drain-to-source voltage. Conversely, if transistor 2 is "erased" (no trapped electrons at floating gate FG), transistor 2 will conduct in response to a positive drain-to-source voltage.

Programming and erase operations are enabled by constructing coupling capacitor 6 to have a much larger capacitance than tunneling capacitor 4, for example at least ten times the capacitance of tunneling capacitor 4. As a result, if a differential voltage is applied at terminal P relative to terminal T, the voltage induced onto floating gate FG will be much closer to the voltage at terminal P than to the voltage at terminal T. This differential voltage will thus primarily appear across tunneling capacitor 4, in which case any electrons that tunnel to and from floating gate FG, as a result of this differential voltage, will do so through tunneling capacitor 4.

FIGS. 1b and 1c are plan and cross-sectional views, respectively, of an example of conventional memory cell 1. Tunneling capacitor 4 is constructed as a polysilicon-to-bulk capacitor, by a portion of polysilicon element 15 overlying n-well 10a at a "moat" region of its surface defined by field oxide structures 16 (FIG. 1c). Diffusion 12a is a heavily doped p-type diffused region formed into this moat region of n-well 10a, in a self-aligned manner relative to polysilicon element 15 as shown in FIG. 1c. Some lateral diffusion of the dopant extends diffusion 12a for a small distance under the edge of polysilicon element 15, as shown. This lateral diffusion enhances the capacitive coupling of tunneling capacitor 4. The size of tunneling capacitor 4 is defined by the area underlying polysilicon element 15 within the moat region of n-well 10a. As shown in the cross-section of FIG. 1c, dielectric film 20 is disposed between polysilicon element 15 and the surface of n-well 10a, and serves as the capacitor dielectric. To enable tunneling of electrons therethrough, dielectric film 20 is a relative thin layer, typically of silicon dioxide or silicon nitride, for example on the order of 80 Å to 150 Å in thickness. N-type diffusion 14a within n-well 10a provides a non-rectifying top-side electrical contact to n-well 10a. Contact openings C indicate the location of conductive contacts through overlying dielectric layers to the diffused regions in the structure of FIG. 1b. For example, terminal T is connected by way of an overlying metal or other conductor level (not shown) through contact openings C in common to diffusions 12a, 14a. As such, p-type diffusion 12a within n-well 10a is at the same potential as n-well 10a itself, serving as the opposing plate of tunneling capacitor 4 from polysilicon element 15.

Coupling capacitor 6 is also a polysilicon-to-bulk capacitor, again with dielectric film 20 serving as the capacitor dielectric at moat regions of the surface of n-well 10b defined by field oxide structures 16. P-type diffused region 12b is defined in n-well 10b in a self-aligned manner relative to polysilicon element 15. Lateral diffusion of p-type region 12b under polysilicon element 15 also enhances capacitive coupling in coupling capacitor 6. N-type diffusion 14b provides a non-rectifying connection to n-well 10b. Terminal P is connected by a metal conductor level (not shown) in common to diffusions 12b, 14b via contact openings C, to set the potential of one plate of coupling capacitor 6. Polysilicon element 15 serves as the other plate of coupling capacitor 6.

Transistor 2 is an n-channel MOS transistor realized by n-type diffusions 14c, 14d within a moat region defined by field oxide structures 16 at the surface of p-well 18 (FIG. 1c). In the conventional manner, n-type diffusions 14c, 14d are formed by n+ source-drain diffusion after the formation of polysilicon element 15, so that transistor 2 is of the self-aligned type (the portion of moat region 14c underlying polysilicon electrode 15 remains p-type, as usual for an n-channel transistor). Dielectric film 20 serves as the gate dielectric for transistor 2, at locations underlying polysilicon element 15. Drain terminal D is connected to n-type diffusion 14c through contact C on one side of polysilicon element 15, and source terminal S is connected to n-type diffusion 14d on another side of polysilicon element 15. P-type diffusion 12c is also defined within p-well 18 to provide contact to the body node of transistor 2 via a corresponding contact C. Typically, this body node contact via p-type diffusion 12c is at the same potential as source terminal S. And as shown in FIG. 1c, n-wells 10a, 10b and p-well 8 are formed at a surface of substrate 19, which is lightly-doped p-type single crystal silicon.

As shown in FIG. 1b, polysilicon element 15 is a single unitary structure that serves as a plate of capacitors 4, 6 and as floating gate FG of transistor 2 in memory cell 1. The area defined by polysilicon element 15 in the moat region of n-well 10b is much larger than that defined by polysilicon element 15 at moat regions of n-well 10a, because of the shape of polysilicon element 15 and also because of the relative sizes of n-wells 10a, 10b. As shown in FIG. 1b, polysilicon element 15 has three "fingers" overlying n-well 10b, but only a single shorter length overlying n-well 10a. This difference in underlying area establishes the difference in capacitance between tunneling capacitor 4 and coupling capacitor 6.

In operation, the state stored by conventional memory cell 1 is programmed and erased by differential voltages applied to terminals P and T. The bulk of any differential voltage across terminals P and T appears as a voltage drop across tunneling capacitor 4, because of the much larger capacitance of coupling capacitor 6 relative to tunneling capacitor 4. Therefore, to "program" transistor 2 by trapping electrons on floating gate FG, the voltages applied to the terminals of memory cell are:

| Terminal P | Terminal T | Terminal D | Terminal S |
|---|---|---|---|
| $+V_p$ | 0 v | 0 v | 0 v | where $+V_p$ is a relatively high voltage (e.g., +12 to 15 volts). Because the differential voltage $+V_p$ mostly couples to floating gate FG, a relatively high voltage (approaching voltage $V_p$) is established across tunneling capacitor 4. If this voltage is sufficiently high to enable electrons to tunnel through dielectric layer 20, and because polysilicon element 15 is at a positive voltage relative to p-diffusion 12a and n-well 10a, electrons will tunnel from these structures to polysilicon element 15. Upon removal of this programming bias condition, those electrons will remain trapped on the electrically isolated polysilicon element 15.

Conversely, memory cell 1 is erased by removing trapped electrons from polysilicon element 15. This is accomplished by the bias condition:

| Terminal P | Terminal T | Terminal D | Terminal S |
|---|---|---|---|
| 0 v | $+V_e$ | 0 v | 0 v | where $+V_e$ is some relatively large voltage (e.g., +12 to 15 volts) of positive polarity relative to ground (at terminal P). Again, because of the differences in capacitance between tunneling capacitor 4 and coupling capacitor 6, polysilicon element 15 is at a potential that is relatively close to ground. Because the voltage at n-well 10a and p-diffusion 12a is high relative to that of polysilicon element 15, the electrons that were trapped on polysilicon element 15 can tunnel through dielectric layer 20 to n-well 10a and p-diffusion 12a. This "erased" state remains after removal of bias, because of the electrical isolation of floating gate FG.

The state of memory cell 1 is read by applying the bias condition:

| Terminal P | Terminal T | Terminal D | Terminal S |
|---|---|---|---|
| 0 v | 0 v | $V_D$ | 0 v | where drain voltage $V_D$ establishes a sufficient drain-to-source voltage to enable drain-to-source conduction to distinguish the state of memory cell 1. The specific level of drain voltage $V_D$ depends on the characteristics of transistor 2, on the desired level of drain-to-source current, and on the available voltages within the integrated circuit. In this conventional approach, if electrons are trapped on polysilicon element 15 (memory cell 1 is programmed), these electrons will effectively raise the threshold voltage (or, if preferred, reduce the gate potential of transistor 2 relative to the source voltage) so that no drain-to-source conduction occurs. Conversely, if electrons are not trapped on polysilicon element 15 (memory cell 1 is erased), the absence of electrons will result in a lower threshold voltage (or a higher gate potential), specifically a threshold voltage that enables source-drain conduction through transistor 2 under these bias conditions. The presence and absence of source-drain conduction through transistor 2 thus indicates whether memory cell 1 is programmed or is erased.

While memory cell 1 provides non-volatile data storage in a structure that can be constructed by a relatively simple process technology (i.e., single polysilicon), this construction of memory cell 1 is quite costly in terms of integrated circuit chip area. The chip area required for memory cell 1 is substantial considering that three separate components (transistor 2, tunneling capacitor 4, and coupling capacitor 6) must be provided in each memory cell 1. In addition, because the programming and erase operations described above apply relatively large differential voltages, good electrical isolation must be maintained between those structures. As shown in FIG. 1b for this example, this electrical isolation is accomplished by enforcing a minimum distance $d_{well}$ between n-wells 10a, 10b, and also on the other three sides of each of n-wells 10a, 10b relative to structures in neighboring memory cells. This minimum well spacing $d_{well}$ may also be impacted, in some cases, by the required spacing $d_{SD}$ between n-well 10a (and also n-well 10b, if applicable) and the moat region within p-well 18 at which the diffusions 14c, 14d of transistor 2 are formed. This spacing $d_{SD}$ is determined by the ability of field oxide structures 16 (FIG. 1c) to isolate surface conduction between n-well 10a and these p-type diffusions 14c, 14d. Depending on the particular geometry of the device, if the sum of two instances of this spacing $d_{SD}$ (i.e., on either side of transistor 2) and the channel width of transistor 2 may exceed the well-to-well spacing $d_{well}$, then the well-to-moat spacing $d_{SD}$ may be the defining feature in establishing the chip area required for memory cell 1, and thus the entire EEPROM array.

BRIEF SUMMARY OF THE INVENTION

Embodiments of this invention provide a memory cell structure and method of manufacturing the same that reduces the chip area Embodiments of this invention also provide such a structure and method that can be realized by way of a single polysilicon manufacturing process.

Embodiments of this invention also provide such a structure and method that enables the use of either p-type or n-type devices to realize the structure.

Embodiments of this invention also provide such a structure and method that eliminates cell-to-cell leakage.

Other objects and advantages provided by embodiments of this invention will be apparent to those of ordinary skill in the art having reference to the following specification together with its drawings.

The present invention may be implemented into a single polysilicon level electrically erasable programmable "read-only" memory (EEPROM) cell structure and method of fabricating the same, in which the sense (or read) transistor and the tunneling region are combined into a single structure. The memory cell is formed by the combination of the combined transistor and tunneling region, with a coupling capacitor spaced apart therefrom. A polysilicon plate of the coupling capacitor is formed in the same polysilicon element that also serves as the transistor gate and tunneling capacitor plate.

According to another aspect of the invention, trench isolation structures extending to a buried oxide layer isolate the coupling capacitor from the combined sense transistor and tunneling region. This trench isolation enables the two structures to be placed closer together, further reducing the chip area required to realize the EEPROM cell. In addition, the trench isolation enables the transistor to be formed as either an n-channel or a p-channel device.

DETAILED DESCRIPTION OF THE INVENTION

Embodiments of this invention will be described in connection with its preferred embodiment, namely as implemented into an integrated circuit including electrically erasable read-only memory functionality, particularly such functionality that is embedded into a larger scale integrated including other functional logic or other circuitry, because it is contemplated that this invention is especially beneficial when realized in such an integrated circuit. However, it is also contemplated that the benefits of this invention can be attained when implemented in other integrated circuit applications. Accordingly, it is to be understood that the following description is provided by way of example only, and is not intended to limit the true scope of this invention as claimed.

Figure 2:
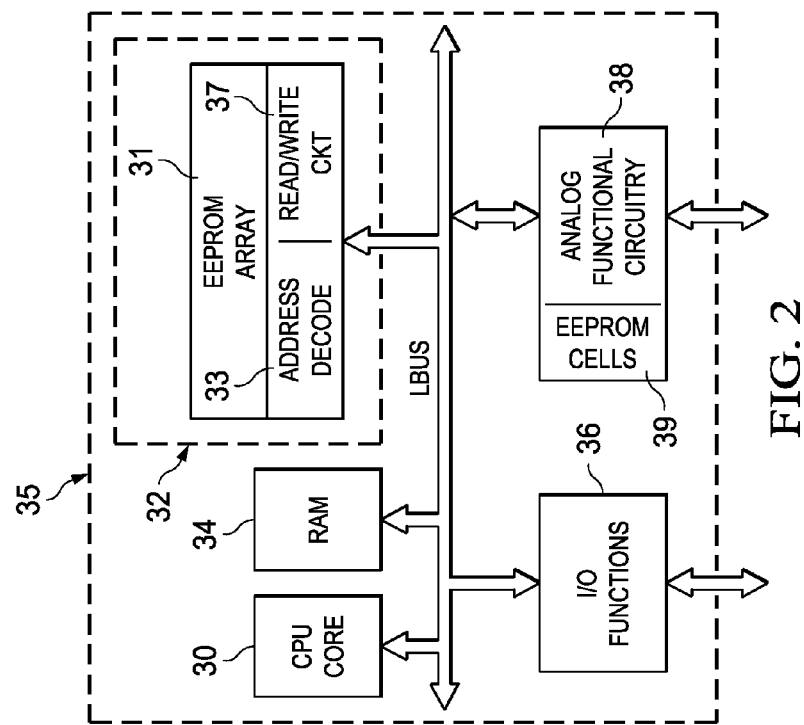
FIG. 2 is an electrical diagram, in block form, of an integrated circuit including EEPROM memory cells constructed according to embodiments of this invention.

An example of an embodiment of the invention is illustrated, in functional block diagram form, in FIG. 2. Integrated circuit 35 is a large scale integrated circuit, including functional circuitry in combination with embedded electrically erasable read-only (EEPROM) memory 32, all formed in the same integrated circuit die or chip. In this example of FIG. 2, the functional circuitry constitutes central processing unit (CPU) core 30, which is a conventional microprocessor or digital signal processor CPU core as known in the art. Integrated circuit 35 includes such other functions as typical for a large-scale programmable processor, such as read-only memory (RAM) 34, input/output functions 36, and the like, which communicate with CPU core 30 via local bus LBUS. Other circuits such as clock circuits, timers, power management circuits, special functionality, other control circuits such as direct memory access controllers, and the like are also typically included within large scale integrated circuits such as integrated circuit 35.

EEPROM memory 32, as embedded within integrated circuit 35 as shown in FIG. 2, includes EEPROM array 31. As typical in the art, EEPROM array 31 is realized by a relatively large number of EEPROM memory cells arranged in rows and columns. Access to the desired memory cells within EEPROM array 31 is controlled by address decode circuitry 33 within EEPROM memory 32, which in this example selects the desired EEPROM memory cells for reading, programming, or erasing, in response to address signals communicated to EEPROM memory 32 over local bus LBUS. Read/write circuitry 37 applies the appropriate voltage and current levels, as the case may be, to the addressed EEPROM memory cells in order to carry out the desired operation. For a read operation, of course, read/write circuitry 37 will forward signals corresponding to the state of the addressed EEPROM memory cells in array 31 to local bus LBUS; conversely, for a programming operation, read/write circuitry 37 will generate the appropriate programming signals to the addressed memory cells in array 31 according to data signals received over local bus LBUS. As known in the art, erase of cells in an EEPROM memory is typically carried out by erasing a "block" of EEPROM cells at a time (i.e., as in "flash" EEPROM memories), and as such the signals generated by read/write circuitry 37 for an erase operation are typically not dependent on data signals received over local bus LBUS, but rather only dependent upon control signals indicating that an erase is to be performed, and perhaps a block address indicating the block of cells that are to be erased.

Also in this integrated circuit 35, analog functional circuitry 38 is provided. Any one or more of a number of analog functions may be embodied in analog functional circuitry 38, such functions including signal level conversion, bandgap reference voltage generation, reference current generation, voltage regulation, analog input/output functions, and the like. In this embodiment of the invention, EEPROM cells 39 are provided in conjunction with analog functional circuitry 38. EEPROM cells 39 are preferably arranged in some sort of array or arrays, and serve to set "trim" levels useful in the configuration and operation of analog functional circuitry 38. As known in the art, analog functions often rely on the establishment of reference levels (current and voltage), and it is preferred that these reference levels and other operating analog levels be determined as absolute levels, regardless of the device parameters in the integrated circuit. In order to establish such absolute levels, also as known in the art, the ability to "trim" the operation of the analog circuitry to establish the correct levels or operation enables high performance operation over a range of device and manufacturing parameters. In this example, EEPROM cells 39 can be programmed from externally to integrated circuit 35 to "trim" the levels and operation of analog functional circuitry 38.

As evident from the block diagram of integrated circuit 35 in FIG. 2, EEPROM memory 32 and EEPROM cells 39 constitute a relatively small portion of the overall functionality of integrated circuit 35. For example, in the arrangement of FIG. 2, EEPROM memory 32 may serve as the program memory according to which CPU core 30 carries out its functions. As such, the chip area devoted to the fabrication of integrated circuit 35 can be dominated by that required to form CPU core 30 and other functions within integrated circuit 35. As such, for cost reasons, the manufacturing technology selected for the fabrication of integrated circuit 35 will be dependent on the type of technology required for realizing the larger functions such as CPU core 30 and the like, as well as on the cost and price constraints determined by the market for devices having the functionality of integrated circuit 35 considered as a whole. These constraints, and thus the tradeoffs made by the circuit designer, can result in the selection of a manufacturing technology that does not necessarily optimize the chip area required to fabricate EEPROM array 31 and EEPROM cells 39. For example, many integrated circuits that are dominated by logic circuitry require only a single level of polysilicon (for use as transistor gates), in which case only a single-level poly technology is available for EEPROM array 31 and EEPROM cells 39; the expense of a more complex interconnect technology to realize a more efficient EEPROM array 31 and EEPROM cells 39 may not pay off, despite the reduced chip area. However, the chip area required to realize EEPROM array 31, or EEPROM cells 39, or both, can still constitute a significant part of the entire integrated circuit. Therefore, because the chip area required for EEPROM array 31 and EEPROM cells 39 is still "expensive" and is often significant, reduction of that chip area required for these functions can still provide significant cost savings in the manufacture of integrated circuit 35.

Figure 3A:
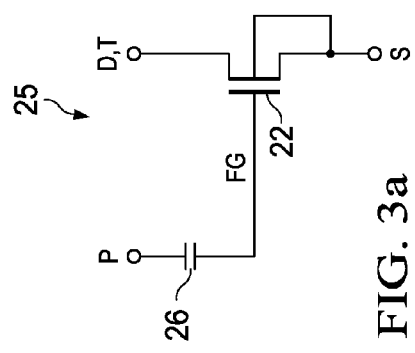
FIGS. 3a and 3b are electrical diagrams, in schematic form, of EEPROM cells constructed according to embodiments of this invention.

According to this embodiment of the invention, the EEPROM cells in EEPROM array 31, and also EEPROM cells 39, are realized according to such a single-level polysilicon technology, in which the chip area required to construct those cells is reduced in comparison with conventional single-level polysilicon realizations of these EEPROM cells. FIG. 3a illustrates the electrical arrangement of EEPROM cell 25 according to an embodiment of this invention, as will now be described.

Similar to conventional memory cells, EEPROM cell 25 includes floating-gate metal-oxide-semiconductor (MOS) transistor 22. As will become evident from the following description, in connection with at least one of the embodiments of this invention, transistor 22 may be constructed as either an n-channel transistor or a p-channel transistor. For purposes of this description, this example of transistor 22 is an n-channel device. Transistor 22 has drain and source terminals that are connected to drain and source semiconductor regions, in the conventional manner, and floating gate electrode FG that controls source-drain conduction. Floating gate FG is connected to one plate of coupling capacitor 26, the other plate of which is connected to programming terminal P. EEPROM cell 25, according to these embodiments of the invention, has a tunneling electrode T that is electrically at the same potential as drain terminal D; the channel region (i.e., body node) of transistor 22 is electrically connected to source terminal S. In programming and erase operations, tunneling electrode T and source and drain terminals S, D are all preferably driven to the same potential in programming and erase operations, by read/write circuitry 37. In read operations (as well as in programming and erase operations), address decode circuitry 33 will drive source and drain terminals S, D of EEPROM cell 25 as appropriate based on the received address value.

Figure 4A:
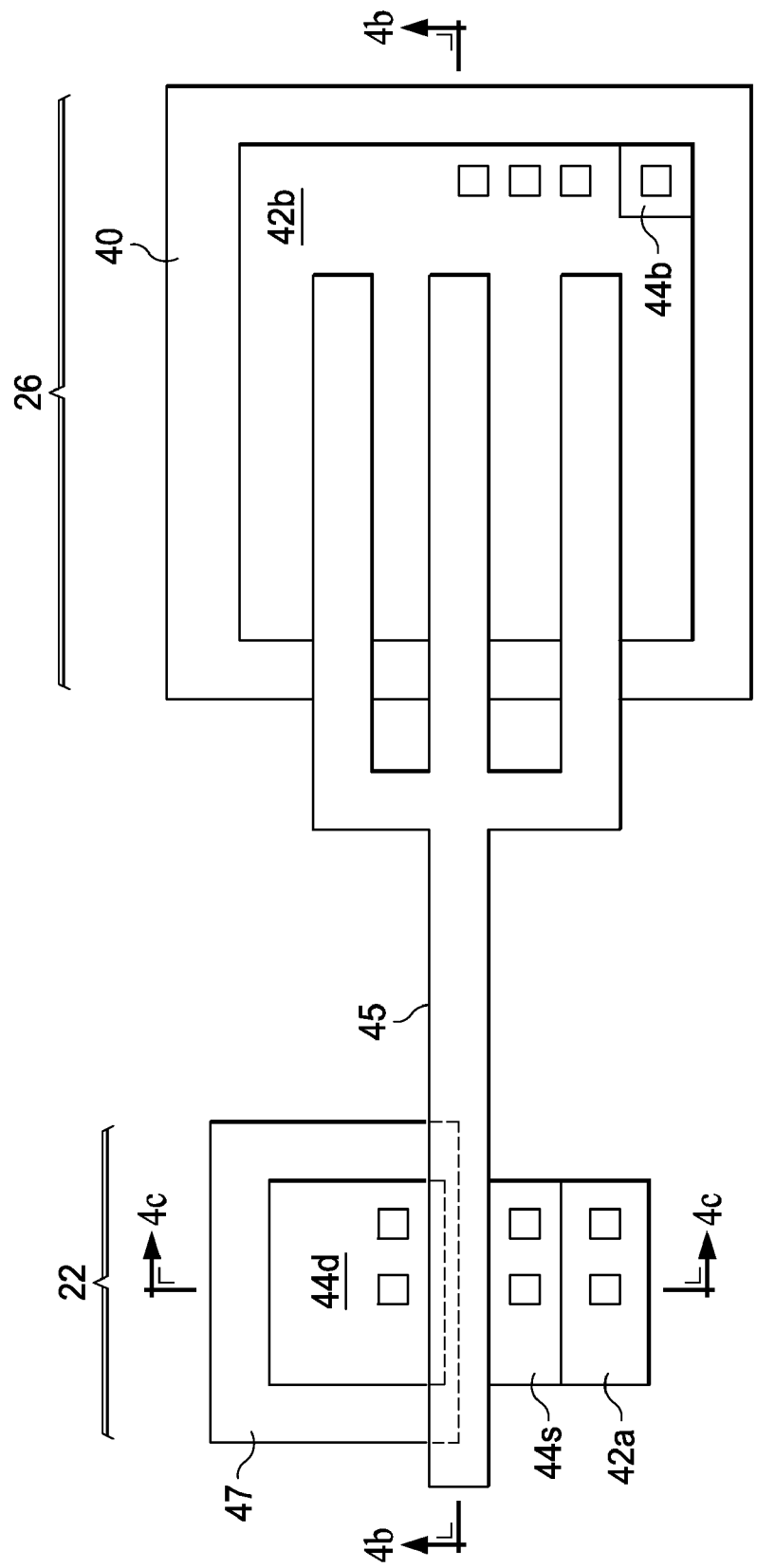
FIG. 4a is a plan view, and FIGS. 4b and 4c corresponding cross-sectional views, of an EEPROM cell constructed according to one embodiment of this invention.
Figure 4B:
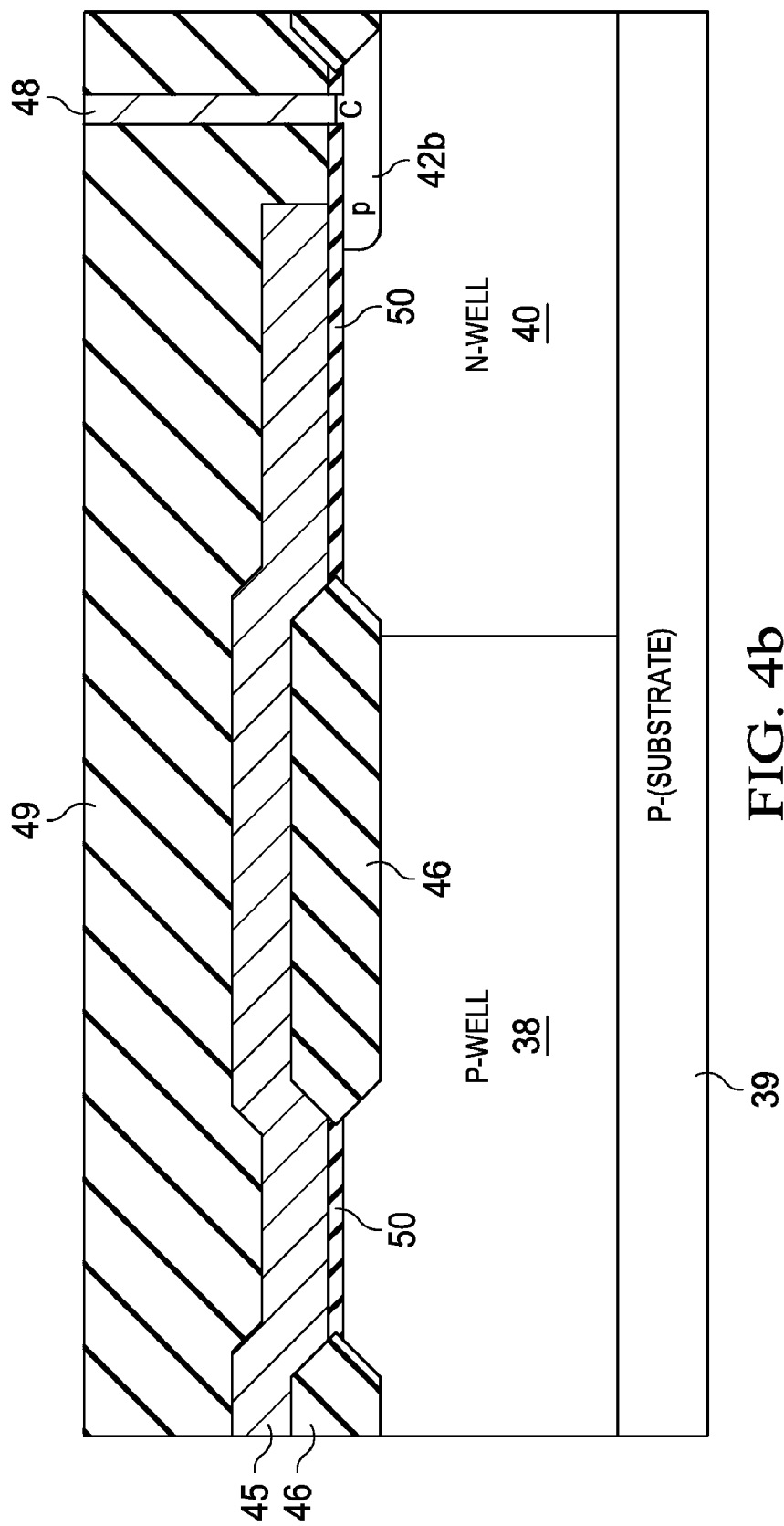
Figure 4C:
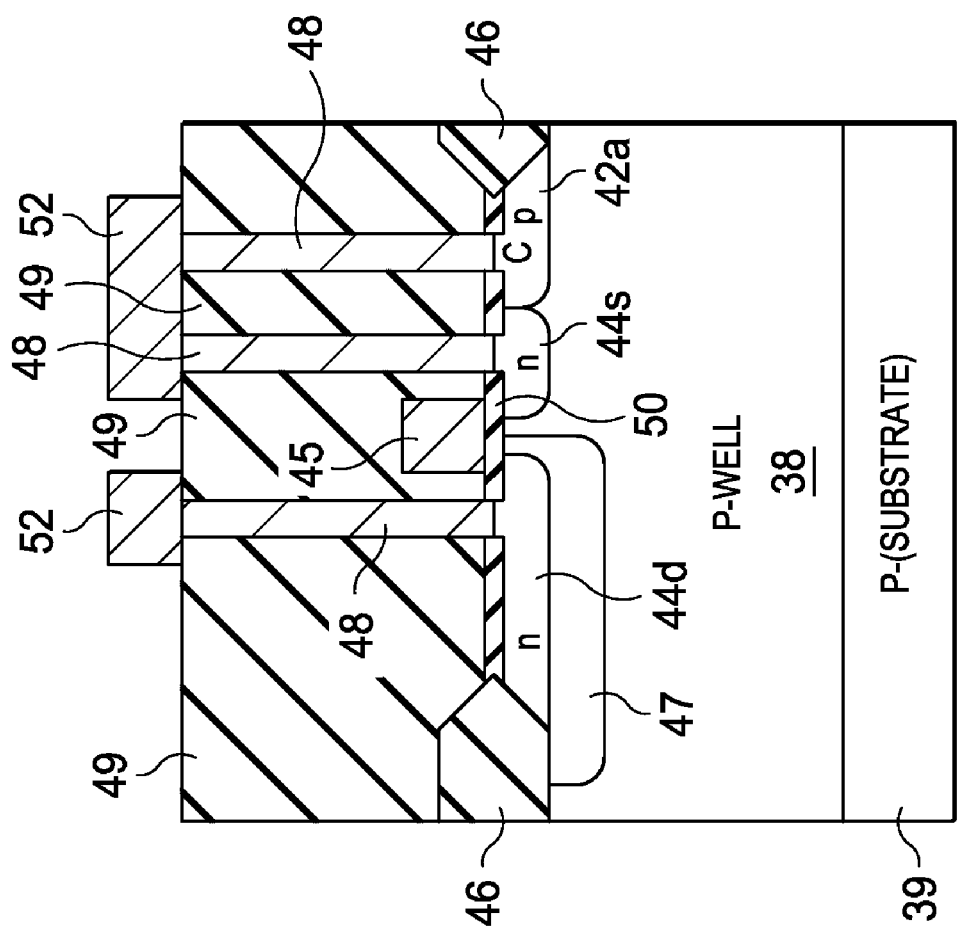

Referring now to FIGS. 4a through 4c, the construction of EEPROM cell 25 according to a first embodiment of the invention will be described. As shown in FIG. 4a, EEPROM cell 25 is constructed as the two components of coupling capacitor 26, and transistor 22, where transistor 22 also serves as the tunneling device in the programming and erasing of EEPROM cell 25.

Coupling capacitor 26 is constructed in the conventional manner, as a polysilicon-to-bulk capacitor. Polycrystalline silicon element 45 overlies a portion of n-well 40, which is a somewhat lightly-doped region formed at a surface of a substrate, overlying lightly-doped p-type substrate 39 in this example (FIGS. 4b and 4c). P-type diffusion 42b is formed in a self-aligned fashion relative to polysilicon element 45, with some lateral diffusion occurring under the edges of polysilicon element 45 as evident in FIG. 4b. This lateral diffusion enhances the capacitive coupling in coupling capacitor 26. Alternatively, p-type diffusion 42b may be formed by way of a masked implant prior to the formation of polysilicon element 45, in which case p-type diffusion 42b will not be self-aligned (or necessarily aligned in any fashion) relative to polysilicon element 45. In the example of FIGS. 4a and 4b, the area of p-type diffusion 32b is also defined by field oxide structures 46, such that p-type diffusion 42b is formed within a "moat" region at a surface of n-well 40. Electrical contact to p-type diffusion 42b is made by metal conductor plug 48, disposed within contact opening C through interlevel oxide layer 49 and any other layers overlying the structure of EEPROM cell 25, as shown in FIG. 4b. N+ diffusion 44b is also formed into the surface of n-well 40, enabling a non-rectifying electrical contact to n-well 40 from the surface. It is contemplated that N+ diffusion 44b and p-type diffusion 42b will be biased to the same voltage during programming and erase operations, if not at all times.

Polysilicon element 45 overlies the surface of the moat region of n-well 40, separated from that surface by a thin layer of dielectric film 50. In this example, dielectric film 50 is a relatively thin layer of silicon dioxide, silicon nitride, some mixture of the two, or another dielectric material. As will be evident from the following description, dielectric film 50 should be of a thickness adequate for reliable DC electrical insulation between polysilicon element 45 and the underlying silicon, while still enabling tunneling of electrons therethrough at reasonable voltages. For example, dielectric film 50 may be formed of silicon dioxide, from about 80 Å to 150 Å in thickness. Dielectric film 50 of course serves as the capacitor dielectric of coupling capacitor 26. As evident the area of coupling capacitor 26 is increased by the digital shape of polysilicon element 45 overlying the surface of n-well 40. It is useful to construct coupling capacitor 26 to have as high a capacitance as practicable, to increase the coupling ratio of coupling capacitor to transistor 22, as will become apparent from the following description.

Transistor 22 is formed in p-well 38, which is at a surface of the substrate overlying lightly-doped p-type substrate 39, abutting n-well 40. Field oxide structures 46 separate the moat regions of p-well 38 and n-well 40 from one another, as evident from FIG. 4b. In this embodiment of the invention, transistor 22 is formed to include lightly-doped n-type diffusion 47, within which n+ drain diffusion 44d is formed. N+ source diffusion 44s is formed at the same time as n+ drain diffusion, on an opposite side of a portion of polysilicon element 45, at the moat region defined by field oxide structures 46 at p-well 38. P+ diffusion 42a is formed at the surface of p-well 38, at a location abutting source diffusion 44s, to provide a non-rectifying contact to p-well 38 and thus to the channel region of transistor 22. Dielectric layer 50 is present under polysilicon element 45 over p-well 38, typically at the same thickness and composition as that described above relative to coupling capacitor 26.

FIG. 4c illustrates the arrangement of diffusions 42a, 44s, 44d, 47 in the structure of transistor 22 according to this embodiment of the invention. As shown in FIG. 4c (and also in FIG. 4a), lightly-doped diffusion 47 extends for some distance under polysilicon element 45 in the channel region of transistor 22, either by way of a masked implant of the n– dopant prior to the formation of polysilicon element 45, or by use of an angled implant. N+ diffusions 44d, 44s are formed in a self-aligned manner relative to polysilicon element 45, with some lateral diffusion under polysilicon element 45 in the usual manner. It is the lateral diffusion of N+ diffusion 44d under polysilicon element 45, and to some extent the lateral diffusion of lightly-doped diffusion 47 under polysilicon element 45, that serves as tunneling electrode T in EEPROM cell 25 according to this embodiment of the invention. Alternatively, conventional sidewall spacer technology may be used to more precisely define the setback of n+ source/drain diffusions 44d, 44s from the lightly-doped n-type diffusion 47, although this approach would also form a lightly-doped region surrounding source diffusion 44s.

The function of lightly-doped n-type region 47 surrounding n+ drain diffusion 44d is to reduce the abruptness of the electric field at the drain side of transistor 22, and thus improve the breakdown voltage at the drain-well junction in transistor 22, considering the relatively high voltage that will be applied to this junction during the erasure of EEPROM cell 25, as will be described below. In the arrangement of FIGS. 4a through 4c, breakdown of that junction would result in conduction to n-well 40. This breakdown vulnerability is somewhat enhanced by this construction of EEPROM cell 25, because the tunneling capacitor (and thus the high electric field causing the breakdown) is much closer to n-well 40 for coupling capacitor, because of the implementation of this capacitor as a parasitic capacitor within read transistor 22. Accordingly, in order to attain the smaller chip area for realizing EEPROM cell 25, according to this embodiment of the invention, it is useful to reduce the junction breakdown vulnerability at the drain-well junction of transistor 22 by including lightly-doped n-type region 47.

Interlevel oxide layer 49, formed of deposited silicon dioxide or another dielectric material, overlies the diffusions and also polysilicon element 45 in the conventional manner, as shown in FIGS. 4b and 4c. FIG. 4c illustrates metal plugs 48 that are formed within contact openings C through interlevel oxide layer 49. As evident in FIG. 4c, metal conductors 52 are disposed above interlevel oxide layer 49, in contact with metal plugs 48 and arranged in the desired conductor pattern. In this embodiment of the invention, one conductor 52 is connected to those metal plugs that make contact to source diffusion 44s and to p-type diffusion 42a, so that source diffusion 44s and p-type diffusion 42a are held at the same potential.

The manufacturing processing required to construct EEPROM cell 25 according to this embodiment of the invention is contemplated to follow a conventional manufacturing flow for single polysilicon level, field oxide isolated, integrated circuit fabrication. It is contemplated that those skilled in the art having reference to this description will be readily able to construct EEPROM cell 25 according to such conventional process flows.

In operation, according to this embodiment of the invention, the programming, erasure, and reading of EEPROM cell 25 is carried out in response to voltages applied by read/write circuitry 37 (FIG. 2) to the terminals of EEPROM cell 25. As discussed above relative to FIG. 2, those voltages are based on address, control, and data signals forwarded to EEPROM memory 32 over local bus LBUS of integrated circuit 35.

Programming of EEPROM cell 25 is accomplished by biasing terminals P, T, S, and D to enable electrons to tunnel onto polysilicon element 45 through dielectric film 50. In this arrangement, the area defined by polysilicon element 45 overlying the moat region of n-well 40 is substantially larger than the area defined by polysilicon element 45 overlying the moat region of p-well 38. It is contemplated that the ratio of these areas will be on the order of 10:1 or larger. Electrically, therefore, a differential voltage applied between terminal P and terminals T, D, and S will appear primarily across the gate-to-channel region (and drain and source) parasitic capacitor at transistor 22, defined at p-well 38, because the relatively large capacitance of coupling capacitor 26 will pull the potential of floating gate FG (polysilicon element 45) closer to that of terminal P than to the potential of terminal T. The "program" conditions applied to terminals of EEPROM cell 25 are thus:

| Terminal P | Terminals T and D | Terminal S |
|---|---|---|
| $+V_p$ | 0 v | 0 v | where $+V_p$ is a relatively high voltage (e.g., +12 to 15 volts). The voltage across dielectric film 50 at transistor 22 is therefore close to the voltage $+V_p$, and is sufficient to attract electrons from lightly-doped region 47 (and perhaps also from p-well 38 itself and diffusions 44*d*, 44*s*), with sufficient energy to tunnel through dielectric film 50 and into polysilicon element 45. After these voltages are removed, these electrons will remain trapped on electrically isolated polysilicon element 45, affecting the threshold voltage of transistor 22 itself.

Conversely, erasure of EEPROM cell 25 is performed by reversing the programming voltages applied to terminals P, T, S, D:

| Terminal P | Terminals T and D | Terminal S |
|---|---|---|
| 0 v | +$V_e$ | +$V_e$ | where +$V_e$ is again some relatively large voltage (e.g., +12 to 15 volts) of positive polarity relative to ground (at terminal P). Again, the relatively large capacitance of coupling capacitor 26 relative to the parasitic capacitance at transistor 22 causes the largest share of this differential voltage to appear across dielectric film 50 at transistor 22. Free electrons on polysilicon element 45 are thus attracted to lightly-doped region 47 (as well as to diffusions 44*d*, 44*s*, and p-well 38 itself), with sufficient energy to tunnel through dielectric film 50. Upon removal of these bias conditions, polysilicon element 45 is left without those free electrons that tunneled away under the erase bias conditions.

The state of EEPROM cell 25 (i.e., programmed or erased) can be read, of course, by applying sufficient source/drain bias to terminals D, S and detecting whether drain-to-source conduction occurs. The specific level of this drain-to-source voltage $V_{ds}$ depends on the characteristics of transistor 22, on the desired level of drain-to-source current appropriate for sensing yet within safe bounds, and on the available voltages within integrated circuit 35. It is contemplated that the various parameters of transistor 22, including doping concentrations, dielectric film 50 thickness, channel width and length, and the like can be selected by those skilled in the art so that this distinction can be made. This construction should ensure that electrons tunnel to polysilicon element 45 in the programming cycle in sufficient concentration so that source-drain conduction through transistor 22 is prevented under this source-drain bias when EEPROM cell 25 is programmed. And this construction should also ensure that the concentration of these electrons is sufficiently low to ensure detectable source-drain conduction through transistor 22 after EEPROM cell 25 is erased. It is preferred that the erased state of EEPROM cell 25 actually be an "over-erased" state, as known in the art.

Figure 1A:
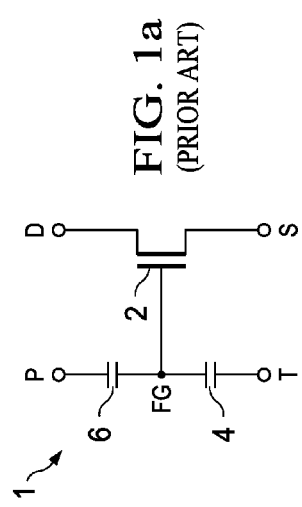
FIG. 1a is an electrical diagram of a conventional single-polysilicon EEPROM memory cell.
Figure 1B:
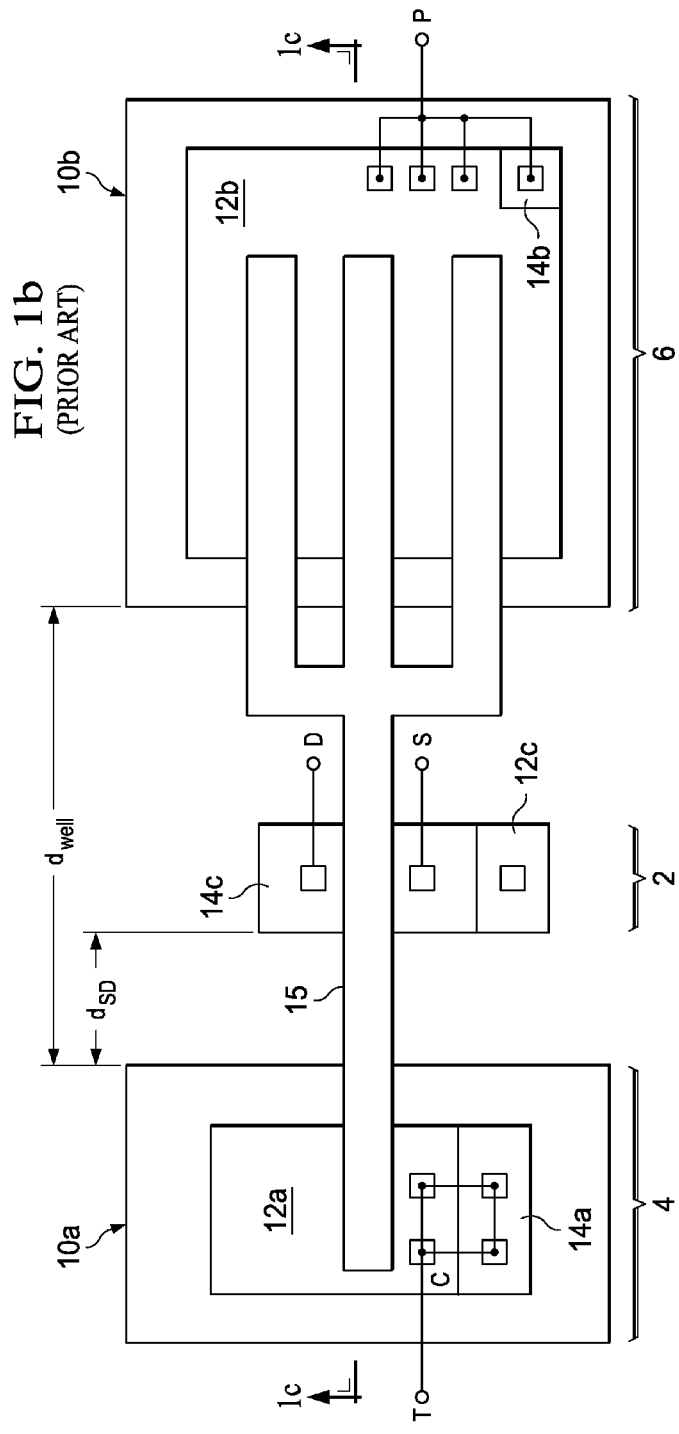
FIGS. 1b and 1c are plan and cross-sectional views, respectively, of a conventional single-polysilicon EEPROM memory cell.
Figure 1C:
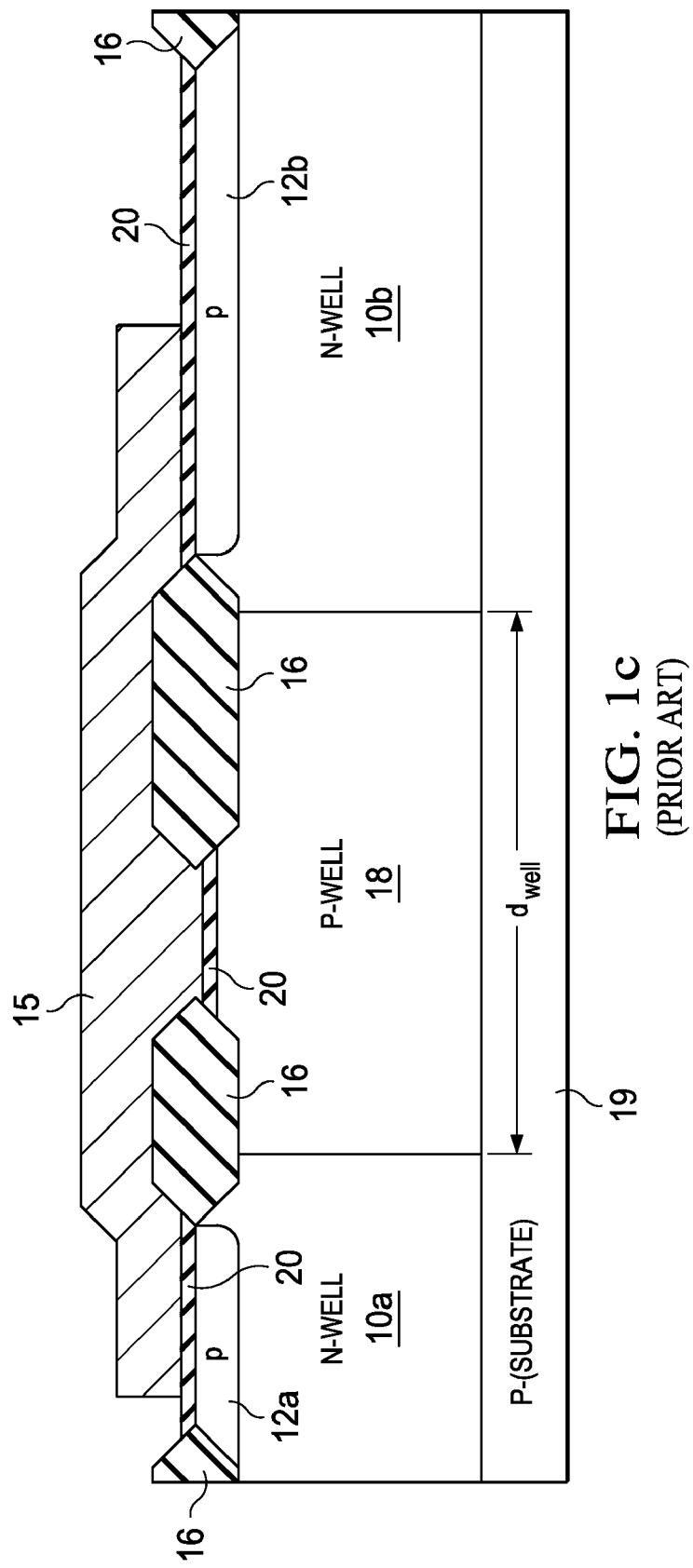

According to this embodiment of the invention, the combining of the read transistor and the tunneling capacitor into single transistor 22 reduces the chip area required to realize EEPROM cell 25 relative to conventional layouts of single poly EEPROM cells, such as that discussed above relative to FIGS. 1*a* through 1*c*. For example, it is contemplated that a chip area saving of on the order of 25% can be attained according to this embodiment of the invention. Accordingly, for integrated circuits in which the functional logic (e.g., CPU core 30 and RAM 34 in integrated circuit 35 of FIG. 2) is to be constructed using single-polysilicon field isolation manufacturing technology, EEPROM cell 25 according to this embodiment of the invention can be constructed efficiently from the standpoint of chip area, without requiring additional process complexity.

Referring now to FIGS. 3*b*, and 5*a* through 5*c*, the construction of EEPROM cell 55 according to another embodiment of the invention will be described. As will become evident from this description, the chip area required to construct EEPROM cell 55 is substantially less than that required to construct EEPROM cell 25 of FIGS. 3*a*, and 4*a* through 4*c*. But as will be described below, the processing required to fabricate EEPROM cell 55 is more complex than that used to realize EEPROM cell 25. Even so, it can be cost effective to construct EEPROM cell 55 if these complex processes are already included in the manufacturing process for realizing the functional circuitry (e.g., CPU core 30 and RAM 34), or if such structures and processing make economic sense in reducing the chip area over the entirety of integrated circuit 35. It is contemplated that these tradeoffs of process complexity vs. chip area can be evaluated by those skilled in the art having reference to this specification.

Figure 3B:
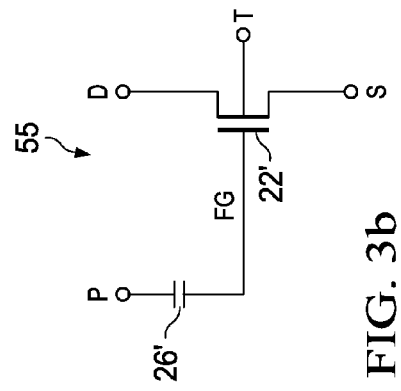

The electrical arrangement of EEPROM cell 55 according to this embodiment of the invention is illustrated schematically in FIG. 3*b*. EEPROM cell 55 according to this embodiment of the invention includes coupling capacitor 26' and read transistor 22'. Tunneling terminal T and drain terminal D can be considered as electrically separate from one another, as shown in FIG. 3*b*.

Figure 5C:
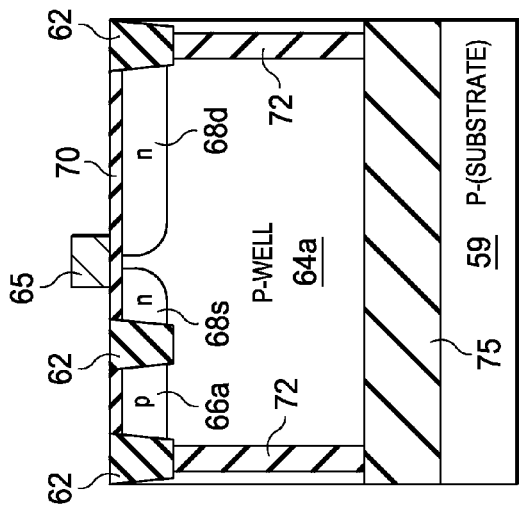
FIG. 5a is a plan view, and FIGS. 5b and 5c corresponding cross-sectional views, of an EEPROM cell constructed according to a second embodiment of this invention.
Figure 5B:
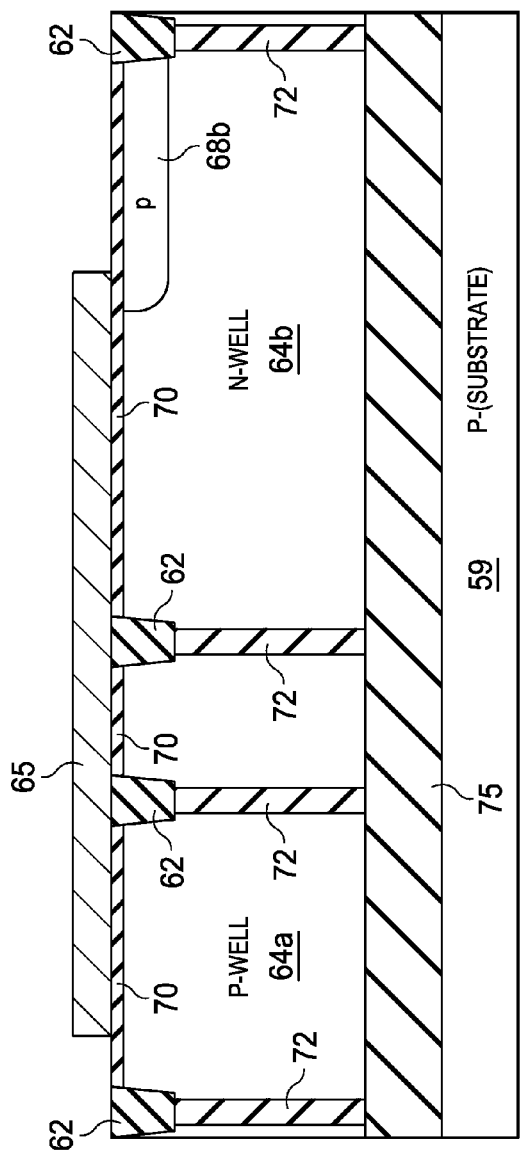

The construction of EEPROM cell 55 is illustrated in FIGS. 5*a* through 5*c*. As shown in FIG. 5*a*, coupling capacitor 26' is a polysilicon to silicon capacitor, formed at the surface of well 64*b*. According to this embodiment of the invention, well 64*b* may be either of n-type or p-type conductivity silicon. One plate of capacitor 26' is formed by polysilicon element 65, which overlies a moat region of well 64*b*. Diffusion 66*b*, which is of an opposite conductivity type from well 64*b*, is formed into well 64*b* in a self-aligned manner relative to polysilicon element 65, with some lateral diffusion occurring which, as mentioned above, will enhance the capacitive coupling. Diffusion 66*b* is of the same conductivity type as well 64*b*, and provides a region at which a non-rectifying electrical contact can be made to well 64*b* from its surface. Contact openings and metal conductors are not shown in FIG. 5*a* (nor in FIGS. 5*b* and 5*c*), for purpose of clarity; it is contemplated that such contact openings and metal conductors and plugs will be formed in the conventional manner, for example as in the manner described above relative to FIGS. 4*a* through 4*c*.

According to this embodiment of the invention, well 66*b* is surrounded by trench isolation structures 62, 72. FIG. 5*b* illustrates these structures, and the construction of capacitor 26' itself according to this embodiment of the invention, in a cross-sectional view. Shallow trench isolation structures 62 consist of deposited dielectric material, such as silicon dioxide, formed into an etched trench at selected locations of the surface of the structure. In many locations, shallow trench isolation structures 62 are disposed at the same location as deep trench isolation structures 72, which similarly are formed of dielectric material (e.g., silicon dioxide) deposited into deep trenches into the structure. In this example, deep trench isolation structures 72 extend from the surface to buried oxide layer 75. As such, coupling capacitor 26' is formed at the surface of well 64*b* (e.g., n-well 64*b* as shown in FIG. 5*b*), which is surrounded by dielectric material on all sides (shallow trench isolation structures 62 and deep trench isolation structures 72) and on the bottom (buried oxide layer 75). As will be discussed further below, this full trench dielectric isolation of well 64*b* not only provides outstanding isolation performance at very high breakdown voltages, but as such also enables other structures (i.e., transistor 22' and neighboring EEPROM cells 55) to be placed closer to capacitor 26' than according to field-oxide-isolation technologies.

Referring back to FIG. 5*a*, transistor 22' is similarly formed in a well surrounded by dielectric material. In the case of transistor 22', well 64a is disposed within isolation structures 62, 72, and overlying buried oxide layer 75 (FIGS. 5b and 5c). Well 64a can be of either p-type or n-type conductivity according to this embodiment of the invention. In this example, well 64a is p-type, such that transistor 22' is an n-channel MOS transistor, with n-type source and drain diffusions 68s, 68d, respectively, formed into a moat region of the surface of p-well 64a in a self-aligned manner relative to polysilicon element 65 (FIG. 5c). Dielectric film 70 underlies polysilicon element 65 at the channel region between source and drain diffusions 68s, 68d, and serves as the gate dielectric of transistor 22'. P-type diffusion 66a enables a non-rectifying electrical contact to be made to p-well 64a from its surface; typically, a common connection will be made to p-well 64a via p-diffusion 66a and to source diffusion 68s, holding these two regions at the same potential. In this embodiment of the invention, an instance of shallow trench isolation structure 62 separates source diffusion 68s from p-diffusion 66a at the surface of well 64a.

As evident from FIGS. 5a and 5c, no lightly-doped n-type region surrounding drain diffusion 68d is required, according to this embodiment of the invention. The requirement for such a lightly-doped region in order to avoid breakdown conduction is eliminated, in this embodiment of the invention, by the use of shallow trench isolation structure 62 and deep trench isolation structure 72 between wells 64a, 64b. These trench isolation structures 62, 72, in combination with buried oxide layer 75, provide improved electrical isolation between these features, so that the breakdown voltage exceeds the voltages applied to the terminals of EEPROM cell 55 in operation. Lightly-doped drain (and source) extensions may be included in EEPROM cell 55, if used elsewhere within integrated circuit 35 or if necessary for transistor performance and reliability. This embodiment of the invention merely eliminates the requirement for such a region for purposes of breakdown prevention within EEPROM cell 55. This enhanced breakdown performance also is reflected in reduced spacing between coupling capacitor 26' and transistor 22', according to this embodiment of the invention, and thus more efficient use of chip area to realize EEPROM array 31.

As shown in FIG. 5b, the trench isolation structures 62, 72 surrounding wells 64a, 64b are laterally separated from one another, with a portion of the silicon substrate or another well disposed therebetween. It is contemplated that wells 64a, 64b may be separated from one another by a single shared trench isolation structure 62, 72, if desired, depending on the electrical isolation performance of that structure. Those skilled in the art will readily recognize, from this specification, the isolation required between these structures for a particular implementation, and can design the layout accordingly.

The operations of programming, erasure, and reading of the state of EEPROM cell 55 will now be described. To summarize, programming of EEPROM cell 55 is performed by attracting electrons through dielectric film 70 to floating polysilicon element 65 is performed by applying a high voltage to n-well 64b and p-diffusion 66b, relative to well 64a, source diffusion 68s and drain diffusion 68d. This mechanism occurs under the bias condition:

| Terminal P | Terminal T | Terminal D | Terminal S |
|---|---|---|---|
| $+V_p$ | 0 v | 0 v | 0 v | where $+V_p$ is a relatively high voltage (e.g., +12 to 15 volts). Because of the difference in capacitance between that of coupling capacitor 26' and the parasitic gate capacitance of transistors 22', the differential voltage between programming terminal P and terminals T, D, S appears primarily across polysilicon element 65 and the channel region (and source and drain) of transistor 22'. Those electrons with sufficient energy to tunnel through dielectric film 70 are thus attracted to polysilicon element 65, and are trapped there after the programming bias condition is removed.

Erasure of EEPROM cell 55 is performed by applying the reverse voltage situation from that of programming:

| Terminal P | Terminal T | Terminal D | Terminal S |
|---|---|---|---|
| 0 v | $+V_e$ | $+V_e$ | $+V_e$ | where $+V_e$ is some relatively high voltage (e.g., +12 to 15 volts). Under this bias condition, a high voltage is applied to p-well 64a, source diffusion 68s, and drain diffusion 68d relative to that applied to n-well 64b and p-diffusion 66b. This voltage again appears primarily across the parasitic gate capacitor of transistor 22', but in this case electrons on polysilicon element 65 are attracted to the channel region (and source and drain) of transistor 22' because of the polarity of the applied voltage. Those electrons of sufficient energy to tunnel through dielectric film 70 are removed through these diffusions and the conductive paths connected thereto.

The state of EEPROM cell 55 is read by applying a drain-to-source voltage ($V_{ds}$) to drain diffusion 68d relative to source diffusion 68s. The specific level of this drain-to-source voltage $V_{ds}$ depends on the characteristics of transistor 22', on the desired level of drain-to-source current, and on the available voltages within integrated circuit 35. If electrons are trapped on polysilicon element 65 (in the programmed state), the external threshold voltage will be sufficiently high to prevent source-drain conduction; conversely, if few or none trapped electrons are present on polysilicon element 65, the threshold voltage will be sufficiently low (effectively depletion mode) so that source-drain conduction occurs. It is contemplated that those skilled in the art will be readily able to construct transistor 22', for example by way of its geometry and doping concentrations, so that transistor 22' performs in this manner and performs the memory cell function.

The use of trench isolation between the structures of EEPROM cell 55 according to this embodiment of the invention greatly reduces the chip area necessary to realize EEPROM array 31 and EEPROM cells 39. For example, for a constant feature size geometry, it is contemplated that the chip area required for a single instance of EEPROM cell 55 can be reduced by as much as 80% from conventional implementations. This radical improvement stems largely from the combination of sharing the tunneling capacitor and read transistor structures, and the use of trench isolation features to enable the close spacing of these structures. In addition, the lightly-doped drain region is no longer essential for purposes of breakdown performance, further enabling the closer placement of these structures. And if trench isolation structures and technology are also being used to realize functional circuitry within integrated circuit 35, this chip area savings is obtained at no added cost in process complexity. Conversely, if the size of EEPROM array 31 (together with any EEPROM cells 39) dominates the chip area for realizing integrated circuit 35 as a whole, economics may favor the use of trench isolation technology, if the chip area savings support this tradeoff.

Figure 6:
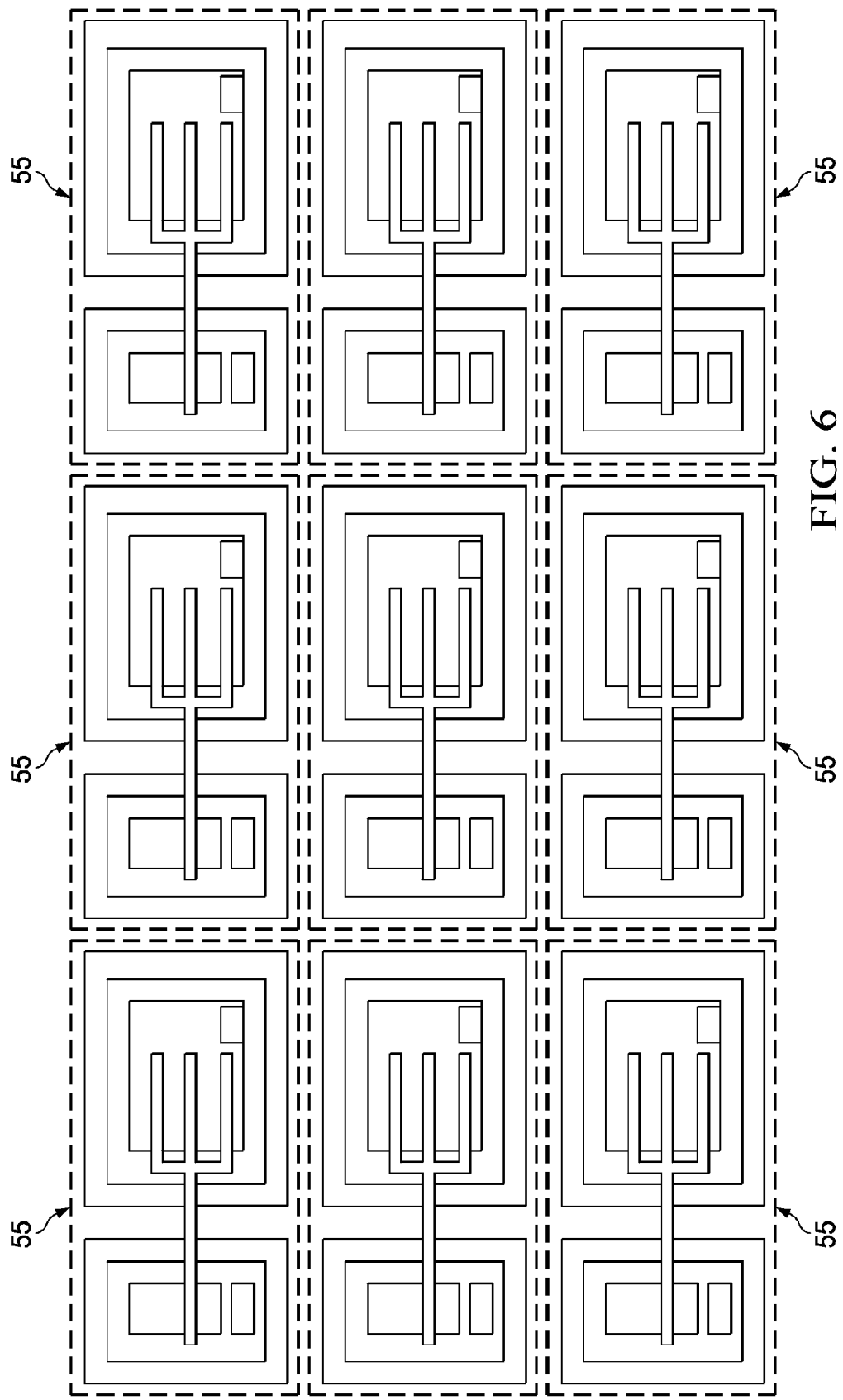
FIG. 6 is a plan view of a portion of an EEPROM array constructed according to the second embodiment of the invention.

FIG. 6 illustrates, in plan view, a portion of EEPROM array 31, or some or all of an array of EEPROM cells 39, as the case may be, including EEPROM cells 55 according to this embodiment of the invention. As evident from that Figure, the close spacing between isolated well regions 64a, 64b is enabled not only within each cell 55, but also between adjacent cells 55.

Referring now to FIGS. 7a through 7d and FIG. 5c, an example of a manufacturing process for fabricating integrated circuit 35 according to this embodiment of the invention will now be described. It is contemplated that variations, additions, subtractions, and substitutions for the particular processes described in connection with this example will be apparent to those skilled in the art having reference to this specification, and that those variations etc. are within the scope of this invention as claimed.

According to this embodiment of the invention, integrated circuit 35 is formed according to a CMOS process flow. However, as known in the art, many integrated circuits 35 now include both bipolar and MOS transistors, and as such require a somewhat more complex process in order to form devices of both types. As such, if bipolar transistors are to also be formed in integrated circuit 35, various processes for forming buried collector regions, emitter regions, etc. will be performed at the appropriate times and places within the manufacturing flow to be described.

Figure 7A:
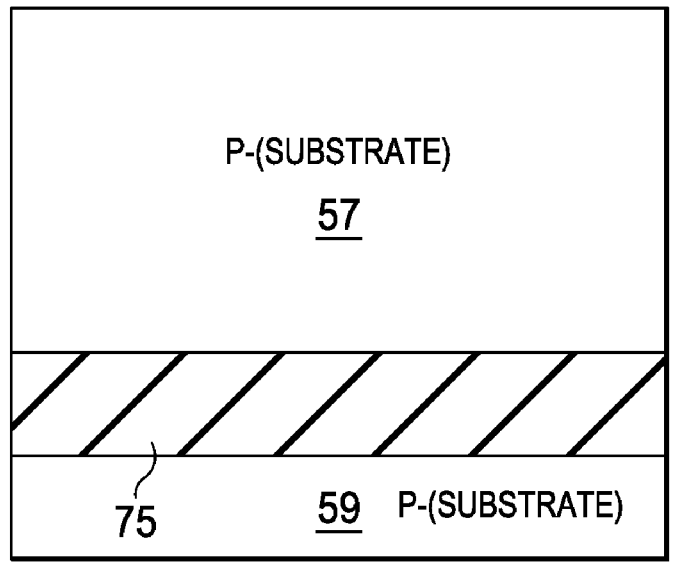
FIGS. 7a through 7d are cross-sectional views illustrating various stages in the manufacture of an EEPROM cell according to the second embodiment of the invention.

FIG. 7a illustrates an initial stage of the manufacture of integrated circuit 35. In this example, integrated circuit 35 is of the "silicon-on-oxide" (or "SOI") type, in which the SOI "substrate" is formed of lightly-doped single-crystal silicon overlying an insulator layer, such as silicon dioxide. A popular modern technology for fabricating SOI substrates is by way of the well-known "smart cut" technique. According to this approach, a single-crystal wafer is thermally oxidized at a surface, flipped over, and the oxide layer bonded to a "handle wafer". Hydrogen is implanted into the silicon surface (from the original backside of the wafer), and the wafer is physically broken along the depth to which the hydrogen was implanted. Chemical-mechanical polishing of the surface of the silicon adhered to the handle layer via the oxide layer then provides a thin single-crystal layer with minimal defects. Of course, other approaches to the formation of SOI starting material may be used, such approaches including the "SIMOX" process in which oxygen is implanted to some depth below the silicon surface and then reacted to form the buried oxide layer.

In any case, according to this embodiment of the invention, manufacture begins with lightly-doped starting material of the desired conductivity type (e.g., p-type) of silicon, and into which transistors and other circuit elements will be formed. This lightly-doped layer at the surface establishes electrical substrate 57, for these devices. Buried silicon dioxide layer 75 underlies substrate 57 at the desired depth. Support is provided by mechanical substrate 59 (e.g., the handle wafer), the electrical or semi-conducting properties of which are not important in this embodiment of the invention.

Figure 7B:
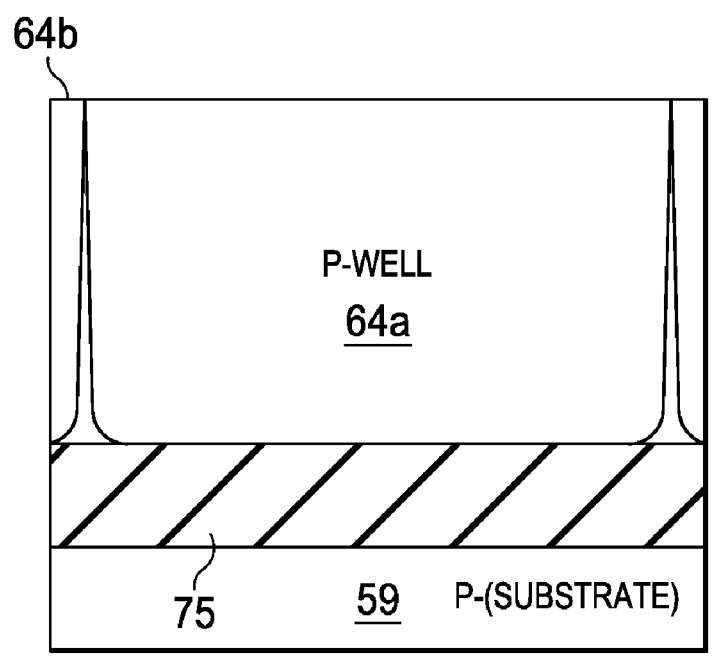

Referring now to FIG. 7b, wells 64a, 64b are now formed within the portion of substrate 57 disposed over buried oxide layer 75. In this example, p-type well 64a is formed by way of a masked implant of boron or another p-type dopant into selected locations of the surface of substrate 57; n-type wells 64b are also formed by way of a masked implant of arsenic, phosphorous, or another n-type dopant into its desired regions. Alternatively, one of the well types can be formed by masked counter-doping of substrate 57 at selected locations, with the opposite well type then formed by the remaining non-counter-doped regions. In any case, a high-temperature anneal or other thermal treatment is then generally performed, after each or both of the well implants, to diffuse the dopant as desired. These and other alternative approaches to the formation of wells 64a, 64b can also be used in connection with this embodiment of the invention.

Figure 7C:
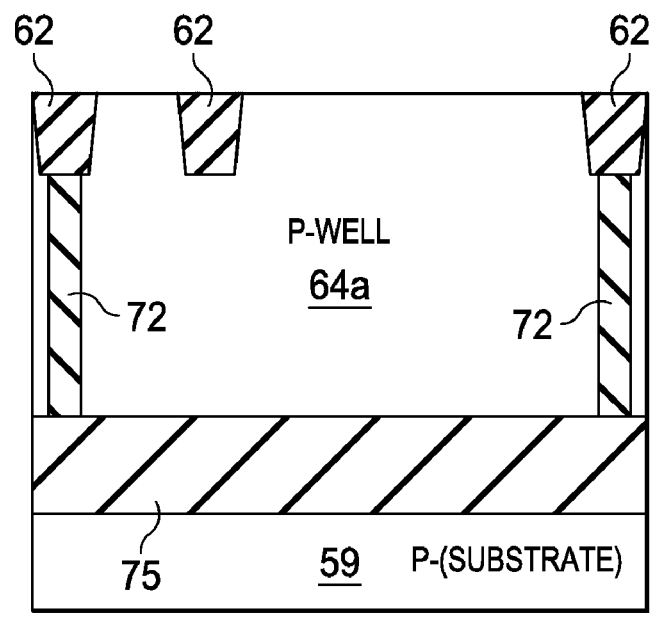

Following the formation of wells 64a, 64b, according to this embodiment of the invention, deep trench isolation structures 72 and shallow trench isolation structures 62 are then formed, resulting in the structure as illustrated in FIG. 7c. Deep trench isolation structures 72 are formed by masked etching of silicon at well boundaries and other desired locations, with the etch continuing until buried oxide layer 75 is reached. Masked silicon etching is also performed at the locations of shallow trench isolation structures 62, either as part of the deep trench etch or separately. The etched trenches, both deep and shallow, are then filled with deposited silicon dioxide or another dielectric material. This deposition can be performed in a single step, creating both structures 62, 72, or alternatively deep trench isolation structures can be filled with deposited oxide prior to the etch of the shallow trench locations. Preferably, a planarization etch is performed after the deposition of the shallow trench isolation oxide, exposing the moat regions of the surface of wells 64a, 64b, and reducing shallow trench isolation structures 62 to be flush with the surface of those moat regions.

The formation of the active devices at these exposed moat regions of wells 64a, 64b can now take place. As known in the art, a threshold adjust implant can be performed at this point, either before or after the formation of dielectric film 70, to define the active characteristics of transistors and capacitors of integrated circuit 35. It is contemplated that p-well 64a and n-well 64b will receive different threshold adjust implants, to optimize the devices formed in each of those regions. Dielectric film 70 can be formed thermally, by reacting the exposed silicon at the surface of wells 64a, 64b in oxygen at high temperature; alternatively, dielectric film 70 can be formed by chemical vapor deposition if desired. Following the formation of dielectric film 70, polysilicon element 65 is formed, for example by deposition of polycrystalline silicon (either doped in situ or doped later by implant and thermal activation), and photolithographic patterning and etching of the deposited polysilicon to define polysilicon element 65 in the desired locations, resulting in the structure shown in FIG. 7d. Additional process steps may of course also be performed in connection with the formation of polysilicon element 65. For example, if a lightly-doped diffusion is to be defined surrounding eventual drain diffusion 68d (and also source diffusion 68s if desired), a masked implant can be performed prior to formation of polysilicon element 65, or an implant may be performed after element 65 is defined. The post-patterning lightly-doped implant can be an angled implant to extend beneath polysilicon element 65, or alternatively can be a normal implant followed by the formation of sidewall spacers on polysilicon element 65, depending on the desired eventual structure. Polysilicon element 65 and exposed silicon at the surface of wells 64a, 64b can then be "silicided" by the direct reaction of a metal such as titanium, tungsten, or the like, if desired to increase the conductivity of these elements.

Figure 7D:
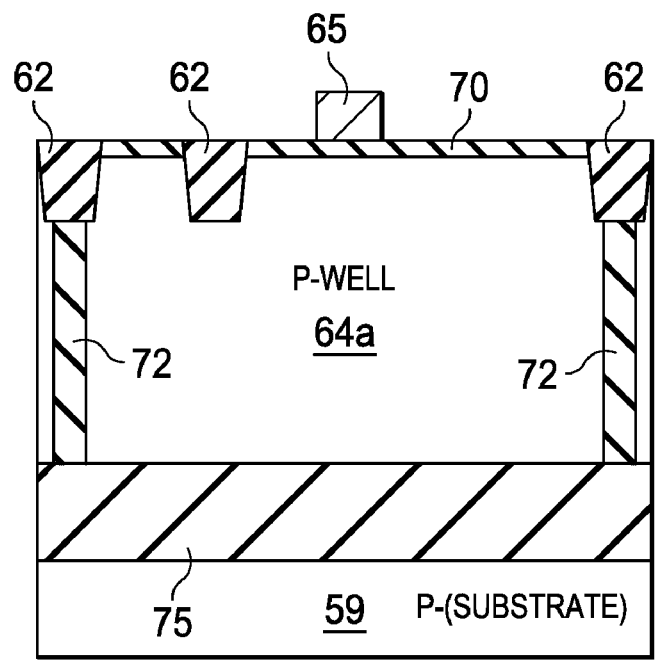

Following the definition of polysilicon element 65 as shown in FIG. 7d, source and drain diffusions 68s, 68d, and capacitor diffusion 66b, can be formed in the conventional manner, typically by ion implant and thermal activation. Of course, considering that both n-type and p-type diffusions 66, 68 are being formed, these implants will be carried out with masks protecting the moat regions in those wells 64a, 64b that are not to receive the heavily-doped implant. Preferably, as mentioned above, these diffusions are formed in a self-aligned manner relative to polysilicon element 65. The resulting structure corresponds to the cross-section shown in FIG. 5c, and described above.

Following this stage in the manufacture, interlevel dielectric material is then typically deposited, followed by the etching of contact openings, deposition of metal plugs, definition of metal conductors, and other "back-end" processing. Of course, the number of metal layers (and polysilicon layers, if desired) will be determined by the particular design and desired process technology and cost factors.

EEPROM cells 25, according to the first embodiment of the invention described in this specification, can be fabricated by a similar process to that described above relative to FIGS. 7a through 7d and 5c. However, the process for fabricating EEPROM cells 25 will differ in that the steps required to form buried oxide layer 75 and trench isolation structures 62, 72 will not be performed; rather, field oxide structures 26 will be formed at the surface of substrate 57, for example according to the well-known local oxidation of silicon (LOCOS) process. In addition, as described above, lightly-doped n-type region 47 will be formed, for example by way of ion implant and thermal activation, either prior to or after the formation of the polysilicon floating gate element. In addition, as evident from the description above, the spacing of the elements of EEPROM cell 25 will differ from that of EEPROM cell 55, to ensure adequate electrical isolation.

Those skilled in the art will recognize, from this description, that integrated circuit 35 including EEPROM cells 25, 55 according to the various embodiments of the invention, and variations thereto, can be readily constructed according to conventional process technology, for example the process technology and manufacturing flow used to form functional circuitry within the same integrated circuit 35 if desired. But according to these embodiments of the invention, the chip area required to construct EEPROM array 31 and EEPROM cells 39 in such integrated circuits 35 is much reduced from that of conventional layout and designs. Accordingly, it is contemplated that embodiments of this invention will provide substantial cost savings and economic benefit, as well as improved EEPROM performance, without necessarily increasing manufacturing process complexity.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating an electrically erasable programmable non-volatile memory in an integrated circuit formed at a surface of a substrate, wherein the memory comprises:

a plurality of memory cells arranged in an array, each memory cell having a coupling capacitor and a combined read transistor and tunneling capacitor, and each memory cell comprising:
a first well region of a first conductivity type at a location of the surface;
a second well region at a location of the surface;
a dielectric layer overlying portions of the first and second well regions;
a polycrystalline silicon gate element disposed over the dielectric layer at locations above the first and second well regions, and having an area overlying the first well region that is substantially larger than an area of the gate element overlying the second well region, the portion of the gate element disposed over the dielectric layer at the first well region defining a coupling capacitor, and the portion of the gate element disposed over the dielectric layer at the second well region defining a combined read transistor and tunneling capacitor;
a first diffused region of a second conductivity type formed at a surface of the first well region at least at locations adjacent to the locations at which the gate element is disposed;
source and drain diffusions disposed in the second well region on opposite sides of the gate element, and of an opposite conductivity type from that of the second well region; and
a plurality of conductor elements making electrical contact to the first well region, to the second well region, and to the source and drain diffusions; and
read/write circuitry, coupled to the plurality of memory cells by way of the conductor elements, for applying voltages to one or more selected memory cells to program, erase, and read the selected memory cells;
and wherein the method comprises:
programming one or more selected memory cells by controlling the read/write circuitry to apply, to one or more selected memory cells via the conductor elements, a positive voltage to the first well region and the first diffused region, relative to the source diffusion and second well region;
erasing one or more selected memory cells by controlling the read/write circuitry to apply, to one or more selected memory cells via the conductor elements, a positive voltage to the source diffusion and second well region, relative to the first well region and the first diffused region; and
reading one or more selected memory cells by applying, to one or more selected memory cells via the conductor elements, a drain-to-source voltage at the drain and source diffusions.

* * * * *